United States Patent
Wu et al.

(10) Patent No.: US 11,094,849 B2
(45) Date of Patent: Aug. 17, 2021

(54) LIGHT EMITTING DIODE DISPLAY

(71) Applicant: PlayNitride Inc., Hsinchu County (TW)

(72) Inventors: Chih-Ling Wu, Hsinchu County (TW); Yi-Min Su, Hsinchu County (TW)

(73) Assignee: PlayNitride Inc., Hsinchu County (TW)

( * ) Notice: Subject to any disclaimer, the term of this patent is extended or adjusted under 35 U.S.C. 154(b) by 189 days.

(21) Appl. No.: 16/659,584

(22) Filed: Oct. 22, 2019

(65) Prior Publication Data
US 2020/0052161 A1 Feb. 13, 2020

Related U.S. Application Data

(63) Continuation-in-part of application No. 15/869,098, filed on Jan. 12, 2018, now Pat. No. 10,490,536.

(30) Foreign Application Priority Data

Oct. 13, 2017 (TW) .................................. 106135067

(51) Int. Cl.
*H01L 33/38* (2010.01)
*H01L 33/40* (2010.01)
*H01L 33/62* (2010.01)

(52) U.S. Cl.
CPC ............ *H01L 33/387* (2013.01); *H01L 33/40* (2013.01); *H01L 33/62* (2013.01)

(58) Field of Classification Search
CPC ....... H01L 25/167; H01L 33/54; H01L 33/62; H01L 25/0753; H01L 33/42; H01L 33/44; H01L 33/20
See application file for complete search history.

(56) References Cited

U.S. PATENT DOCUMENTS

2005/0169571 A1* 8/2005 Kaneko ................. H01L 27/153
 385/14
2006/0049335 A1* 3/2006 Suehiro .................. H01L 33/56
 250/214.1

(Continued)

FOREIGN PATENT DOCUMENTS

TW 201507212 2/2015

OTHER PUBLICATIONS

"Office Action of Taiwan Related Application No. 108148260", dated Apr. 30, 2020, p. 1-p. 7.

*Primary Examiner* — Thanh T Nguyen
(74) *Attorney, Agent, or Firm* — JCIPRNET

(57) ABSTRACT

A light emitting diode display includes a driving substrate, a plurality of micro light-emitting devices, a first common electrode, and a second common electrode. The micro light-emitting devices are arranged on the driving substrate. Each of the micro light-emitting devices includes an epitaxial structure, a first type electrode, and a second type electrode. The first common electrode is disposed on the driving substrate and located between the second type electrodes of the micro light-emitting devices, wherein the first common electrode exposes at least a portion of an upper surface of each of the second type electrodes. The second common electrode is located between the second type electrodes of the micro light-emitting devices and electrically connected to the first common electrode, wherein the second common electrode does not directly contact the micro light-emitting devices.

16 Claims, 11 Drawing Sheets

(56) References Cited

U.S. PATENT DOCUMENTS

2010/0258822 A1* 10/2010 Kobayashi .......... H01L 25/0753
257/88
2012/0326170 A1* 12/2012 Liu ..................... H01L 24/24
257/82
2018/0211991 A1* 7/2018 Hsiang ................. H01L 25/167

* cited by examiner

LIGHT EMITTING DIODE DISPLAY

CROSS-REFERENCE TO RELATED APPLICATION

This application is a continuation-in-part application of and claims the priority benefit of U.S. application Ser. No. 15/869,098, filed on Jan. 12, 2018, now allowed, which claims the priority benefits of Taiwan application serial no. 106135067, filed on Oct. 13, 2017. The entirety of each of the above-mentioned patent applications is hereby incorporated by reference herein and made a part of this specification.

BACKGROUND OF THE INVENTION

1. Field of the Invention

The invention relates to a display apparatus. More particularly, the invention relates to a display apparatus that uses micro light-emitting diodes (LEDs) as display pixels.

2. Description of Related Art

In general, a common electrode and a micro light-emitting diode (LED) of a display panel are disposed in a display region, wherein the micro LED is located in each pixel structure region and is electrically connected to the common electrode, and an image is displayed by means of a driving control between the common electrode and the micro LED. At present, a material of the electrode material which is widely chosen for the production of the micro LED may be indium tin oxide (ITO) that has a high work function of 4.5 eV to 5.3 eV and has a high light transmittance. The existing common electrode is also made of the same material; that is, ITO, and the common electrode completely covers a forward light-emitting surface of the micro LED and should have a certain thickness, so as to have good electrical conductivity. However, since wirings and devices on a driving substrate are not resistant to high temperature, a high-temperature annealing process cannot be performed to obtain a high light transmittance and good electrical conductivity when ITO is used to form the common electrode; thereby, a light-emitting efficiency of the micro LED is lowered because the common electrode with a large thickness, a low light transmittance, and poor electrical conductivity covers the forward light-emitting surface, and a display quality of the display panel is also deteriorated. In addition, compared to metallic materials, ITO has less flexibility and lower toughness, which easily increases the difficulty of manufacturing the common electrode of the display panel, and a process yield and the electrical conductivity of the display panel are thereby affected.

SUMMARY OF THE INVENTION

An embodiment of the invention provides a light emitting diode display that can effectively raise a forward light-emitting efficiency of a micro light-emitting device and increase a transverse conductivity of the light emitting diode display.

A light emitting diode display provided in an embodiment of the invention includes a driving substrate, a plurality of micro light-emitting devices, a first common electrode, and a second common electrode. The plurality of micro light-emitting devices are arranged on the driving substrate. Each of the plurality of micro light-emitting devices includes an epitaxial structure, a first type electrode, and a second type electrode, the first type electrode and the second type electrode being disposed on the opposite sides of the epitaxial structure. The first common electrode is disposed on the driving substrate and located between the second type electrodes of the plurality of micro light-emitting devices, wherein the first common electrode exposes at least a portion of an upper surface of each of the second type electrodes. The second common electrode is located between the second type electrodes of the plurality of micro light-emitting devices and electrically connected to the first common electrode, wherein the second common electrode does not directly contact the plurality of micro light-emitting devices.

In an embodiment of the invention, a transmittance of the second type electrode of each of the plurality of micro light-emitting devices is greater than a transmittance of the first common electrode and/or the second common electrode.

In an embodiment of the invention, a first electrical conductivity of the first common electrode and a second electrical conductivity of the second common electrode are greater than a third electrical conductivity of the second type electrode.

In an embodiment of the invention, the second electrical conductivity of the second common electrode is greater than the first electrical conductivity of the first common electrode.

In an embodiment of the invention, the second common electrode is disposed between the driving substrate, the plurality of micro light-emitting devices and the first common electrode.

In an embodiment of the invention, the first common electrode is disposed between the driving substrate, the plurality of micro light-emitting devices and the second common electrode.

In an embodiment of the invention, a ratio of a first width of the first common electrode to a second width of the second common electrode is greater than or equal to 0.3 and less than or equal to 1.

In an embodiment of the invention, the first width and the second width are less than 10 micrometers.

In an embodiment of the invention, a ratio of a width of the second common electrode to a width of two of the plurality of micro light-emitting devices is greater than or equal to 0.8 and less than or equal to 1.

In an embodiment of the invention, a surface of the first common electrode is completely exposed, and the first common electrode only on sides of the plurality of micro light-emitting devices.

In an embodiment of the invention, a portion of a surface of the first common electrode is exposed, and the first common electrode is disposed on a portion of upper surfaces and sides of the plurality of micro light-emitting devices.

In an embodiment of the invention, an area ratio of an area of the first common electrode disposed on the upper surfaces to an area of the first common electrode is less than or equal to 0.2.

In an embodiment of the invention, a material of the first common electrode and a material of the second common electrode respectively comprise a metal, a conductively polymer material or a combination thereof.

In an embodiment of the invention, a first thickness of the first common electrode and a second thickness of the second common electrode are less than or equal to a third thickness of the second type electrode, respectively.

In an embodiment of the invention, the first thickness of the first common electrode plus the second thickness of the second common electrode is less than or equal to the third thickness of the second type electrode.

In an embodiment of the invention, the light emitting diode display further includes a transparent electrode, disposed on each of the plurality of micro light-emitting devices, the first common electrode and the second common electrode. The transparent electrode at least directly contacts the second type electrode of each of the plurality of micro light-emitting devices and the first common electrode or the second type electrode of each of the plurality of micro light-emitting devices, the first common electrode and the second common electrode.

Based on the above, since the light emitting diode display provided in an embodiment of the invention includes the first common electrode exposing at least a portion of an upper surface of the second type electrode, and the second common electrode located between the second type electrodes of the micro light-emitting devices and electrically connected to the first common electrode, wherein the second common electrode does not directly contact the plurality of micro light-emitting devices. Therefore, the micro light-emitting devices can maintain good forward light-emitting efficiency and has good electrical conductivity.

To make the above features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
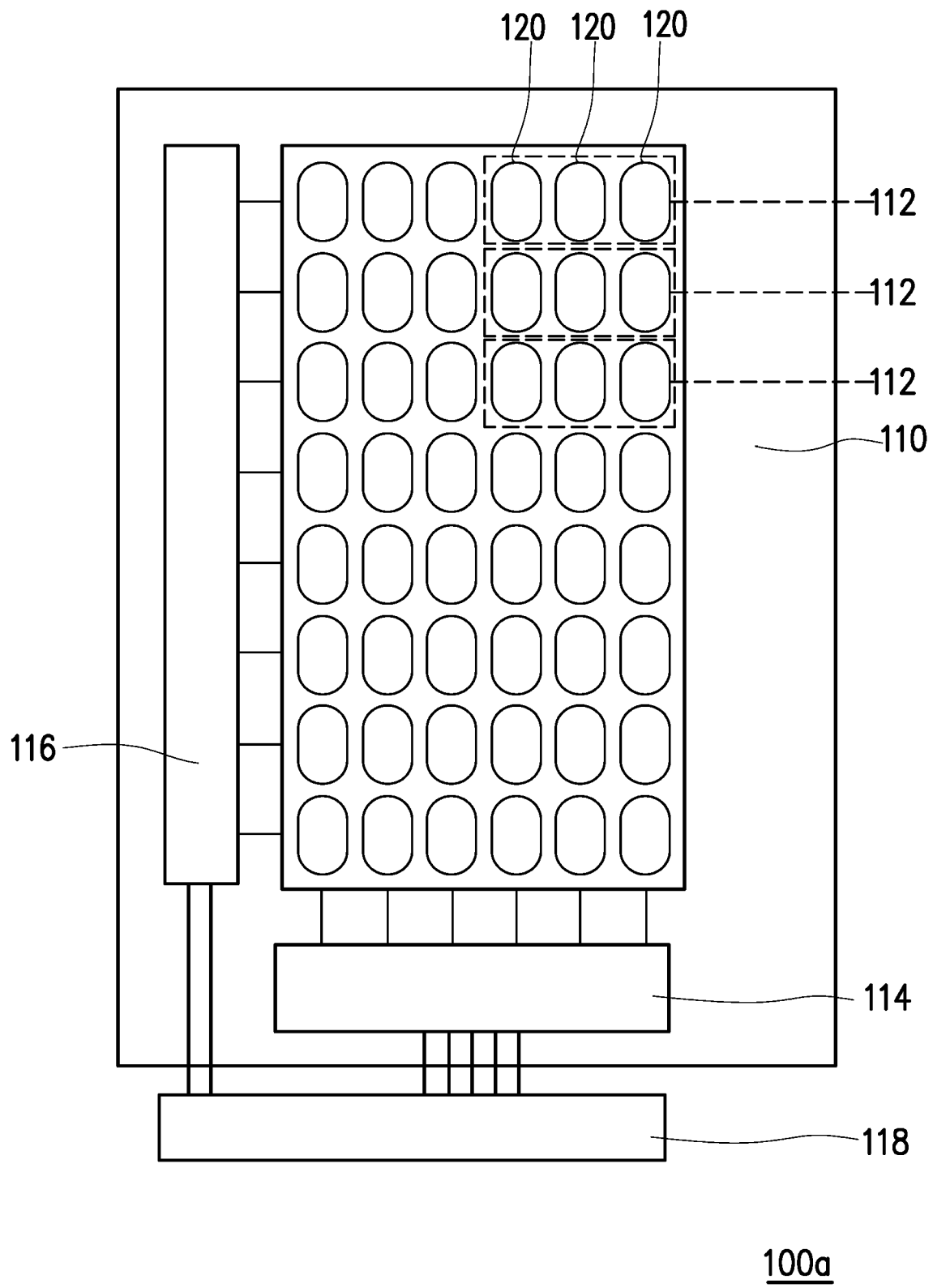
FIG. 1A is schematic top view of a display apparatus according to an embodiment of the invention.
Figure 1B:
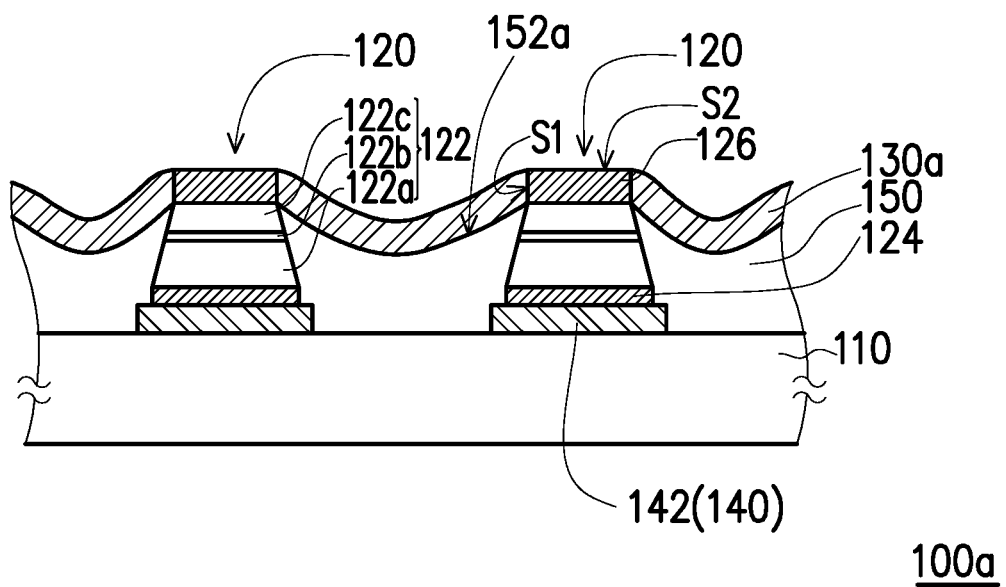
FIG. 1B is a schematic cross-sectional view of a portion of the display apparatus depicted in FIG. 1A.

FIG. 1A is schematic top view of a display apparatus according to an embodiment of the invention. FIG. 1B is a schematic cross-sectional view of a portion of the display apparatus depicted in FIG. 1A. Referring to FIG. 1A and FIG. 1B, a display apparatus 100a provided in the embodiment includes a driving substrate 110, a plurality of micro light-emitting devices 120, and a common electrode 130a. The micro light-emitting devices 120 are separately arranged on the driving substrate 110, and each of the micro light-emitting devices 120 includes an epitaxial structure 122, a first type electrode 124, and a second type electrode 126, wherein the first type electrode 124 and the second type electrode 126 are disposed on the opposite sides of the epitaxial structure 122. The common electrode 130a is disposed on the driving substrate 110 and located between the second type electrodes 126 of the micro light-emitting devices 120, wherein the common electrode 130a exposes an upper surface S2 of each of the second type electrodes 126. Herein, the display apparatus 100a may be a micro LED display. In addition, the embodiment exemplarily illustrates two of the micro light-emitting devices 120, but the invention is not limited thereto. The number of the micro light-emitting devices 120 may be changed according to the actual requirements of those having ordinary skill in the art after learning the invention.

In detail, as shown in FIG. 1A, the driving substrate 110 has a plurality of pixel regions 112, and the micro light emitting devices 120 are separately disposed on the driving substrate 110. At least three of the micro light-emitting devices 120 are disposed in each of the pixel regions 112, wherein each of the micro light-emitting devices 120 is, for example, a sub-pixel capable of emitting lights of different colors. Particularly, the display apparatus 100a provided in the embodiment is further equipped with a scan line driving circuit 114, a data line driving circuit 116, and a control circuit 118. The data line driving circuit 116 and the scan line driving circuit 114 are disposed on the driving substrate 110 and are electrically connected to the driving substrate 110. The micro light-emitting devices 120 may emit light through being driven by the data line driving circuit 116 and the scan line driving circuit 114. Since the data line driving circuit 116 and the scan line driving circuit 114 are electrically connected to the control circuit 118, the light-emitting sequence and the light-emitting timing of the micro light-emitting devices 120 can be adjusted according to the design of the control circuit 118. Herein, the driving substrate 110 provided in the embodiment may be a complementary metal-oxide-semiconductor (CMOS) substrate, a liquid crystal on silicon (LCOS) substrate, a thin film transistor (TFT), or other substrates with operating circuits; the invention is not limited thereto.

Referring to FIG. 1B, the first type electrode 124 and the second type electrode 126 of the micro light-emitting devices 120 are located on opposite sides of the epitaxial structure 122 in the embodiment. Specifically, the first type electrode 124, the epitaxial structure 122, and the second type electrode 126 may be sequentially stacked on the driving substrate 110 according to the present embodiment. That is, the micro light-emitting devices 120 provided in the embodiment may be vertical type micro LEDs, and the maximum width of the vertical type micro LEDs may be 1 μm-100 μm; in an embodiment, the maximum width is 3 μm-50 μm. Herein, a material of the first type electrode 124 and the second type electrode 126 may be platinum, nickel, titanium, gold, silver, chromium, an alloy of the above metals, a high work function metal of the above alloy, e.g., metal oxide (indium tin oxide or zinc oxide), or a conductive non-metallic material, e.g., a conductive polymer, graphite, graphene, or black phosphorus. Herein, a material of the second type electrode 126 may be a transparent conductive material or a semi-transparent conductive material, such as metal oxide with a high light transmittance, so that a light generated by a light-emitting layer 122b may exit from the second type electrode 126. Particularly, the second type electrode 126 provided in the embodiment is indium tin oxide (ITO) with a light transmittance greater than 90%. A thickness of the second type electrode 126 of each of the micro light-emitting devices 120 may be greater than or equal to a thickness of the first type electrode 124, so as to enhance a manufacturing yield and a success rate of the display apparatus 100a. For example, depending on factors such as craftsmanship, the thickness of the first type electrode 124 may be from 3,000 Å to 25,000 Å, and the thickness of the second type electrode 126 may be from 3,000 Å to 10,000 Å in the actual manufacturing process, which ensures greater flexibility if a subsequent photolithography and etching process or another process performed on the common electrode 130a on the second type electrode 126. In addition, the maximum peak current density of an external quantum efficiency curve of the micro light-emitting devices 120 is preferably between 0.01 A/cm$^2$ and 2 A/cm$^2$ according to an exemplary embodiment of the invention. That is, the micro light-emitting devices 120 provided in the embodiment is suitable for operation at low current density.

Furthermore, the epitaxial structure 122 of each of the micro light-emitting devices 120 includes a first type semiconductor layer 122a, a light-emitting layer 122b, and a second type semiconductor layer 122c. The light-emitting layer 122b is located between the first type semiconductor layer 122a and the second type semiconductor layer 122c, wherein the first type electrode 124 is electrically connected to the first type semiconductor layer 122a, and the second type electrode 126 is electrically connected to the second type semiconductor layer 122c. Herein, the first type semiconductor layer 122a is embodied as an N-type semiconductor layer, and the first type electrode 124 is embodied as an N-type electrode; the second type semiconductor layer 122c is embodied as a P-type semiconductor layer, and the second type electrode is embodied as a P-type electrode. However, in other embodiments not shown, the first type semiconductor layer may be a P-type semiconductor layer, and the first type electrode may be a P-type electrode; the second type semiconductor layer may be an N-type semiconductor layer, and the second type electrode may be an N-type electrode; the invention is not limited thereto. As shown in FIG. 1B, a cross-sectional shape of the epitaxial structure 122 may be trapezoidal. That is, a width of the epitaxial structure 122 of each of the micro light-emitting devices 120 gradually decreases in a direction from the first type semiconductor layer 122a to the second type semiconductor layer 122c, so that a difficulty of making the common electrode 130a subsequently may be reduced. Furthermore, the difference in the maximum width of the first type semiconductor layer 122a and the second type semiconductor layer 122c of the epitaxial structure 122 of each of the micro light-emitting devices 120 may be adjusted to be from 0 μm to 5 μm depending on an actual demand of a product design. However, in other embodiments not shown, the width of the first type semiconductor layer may be equal to the width of the second type semiconductor layer; the invention is not limited thereto. In addition, a thickness of the first type semiconductor layer 122a provided in the embodiment may be larger than a thickness of the second type semiconductor 122c. Specifically, the thickness of the first type semiconductor 122a may be from 1 μm to 5 μm, a thickness of the light-emitting layer 122b may be from 0.1 μm to 1 μm, and the thickness of the second type electrode 122c may be from 0.1 μm to 0.5 μm, so that the overall thickness of the epitaxial structure 122 may be controlled to be from 1 μm to 6 μm. As such, the manufacturing yield in the subsequent process and the properties of an end product can be guaranteed.

Referring still to FIG. 1B, the common electrode 130a provided herein is embodied as directly contacting one side surface S1 of the second type electrode 126 of each of the micro light-emitting devices 120, and the micro light-emitting devices 120 arranged on the driving substrate 110 are electrically connected to each other through connecting the side surface S1 of the second type electrode 126 of each of the micro light-emitting devices 120. In particular, the common electrode 130a provided in the embodiment does not cover the upper surface S2 of the second type electrode 126 of each of the micro light-emitting devices 120, so that the micro light-emitting devices 120 have a high aperture ratio. As a result, light generated by the light-emitting layer 122b of the micro light-emitting devices 120 has excellent forward light-emitting efficiency. Herein, the thickness of the common electrode 130a is substantially equal to the thickness of the second type electrode 126. It is worth mentioning that since the second type electrode 126 may have a larger thickness than the first type electrode 124, the common electrode 130a has a larger contact area with the side surface S1 of the second type electrode 126, whereby a connection reliability and a current transmission capability between the common electrode 130a and the second type electrode 126 may be improved. In particular, a ratio of the contact area between the common electrode 130a and the side surface S1 of each of the second type electrodes 126 to an area occupied by the side surface S1 of each of the second type electrodes 126 is from 0.3 to 1. If the ratio is less than 0.3, the contact area may not be enough, and the current transmission may be affected. More preferably, a better electrical connection may be achieved if the ratio is between 0.6 and 1. Herein, the contact area between the common electrode 130a and the side surface S1 of each of the second type electrodes 126 is equal to the area of the side surface S1 of each of the second type electrodes 126. Herein, a material of the common electrode 130a is embodied as metal and may be silver, gold, chromium, copper, platinum, tin, nickel, titanium, aluminum, or an alloy of the above metals, which has favorable electrical conductivity. Herein, the light transmittance of the common electrode 130a made of metal is smaller than the light transmittance of the second type electrodes 126 of the micro light-emitting devices 120, so that it can be used as a reflective layer on the side surface to increase the forward light-emitting efficiency. Although the light transmittance of the common electrode 130a made of metal may be smaller than the light transmittance of the second type electrodes 126 of the micro light-emitting devices 120, the common electrode 130a provided in the embodiment does not cover the upper surface S2 of the second type electrodes 126, and therefore the forward light-emitting efficiency of the micro light-emitting devices is not affected. Besides, when a metal with low resistivity is used as the common electrode 130a, there is a better ohmic contact between the common electrode 130a and the second type semiconductor layer 122c. In addition, a conductivity of the common electrode 130a made of a metallic material may be increased by 10 to 10$^2$ times if compared to a conventional process of using ITO or a transparent metal oxide to form the common electrode, and electrical properties including the current transmission capability of the display apparatus 100a through which the current flows in a transverse manner may be significantly improved. Moreover, metal has extensibility, and thus the difficulty of manufacturing the common electrode 130a may be reduced if the common electrode 130a is made of metal.

An overall configuration of the common electrode 130a and the coverage relationship between the common electrode 130a and an interface of the second type electrode 126 are not limited herein. Specifically, the common electrode 130a provided in the embodiment extends in a wave-like manner between each of the micro light-emitting devices 120, so that yield is lowered because of the excessive breakage when the common electrode 130a is formed. However, in other embodiments, the common electrode 130a may extend in a substantially flat manner between each of the micro light-emitting devices 120. In addition, in other embodiments not shown in the drawings, the common electrode may also partially cover the upper surface of the second type electrode because of process errors caused by etching rate or other factors; as long as the overall forward light-emitting efficiency of the micro light-emitting devices is not affected, the common electrode falls within the scope of the invention.

Next, referring to both FIG. 1A and FIG. 1B, the display apparatus 100a provided in the embodiment further includes a bonding pad 140 disposed on the driving substrate 110 and located between the first type electrode 124 of the micro light-emitting devices 120 and the driving substrate 110. Specifically, the bonding pad 140 provided in the embodiment includes a plurality of bonding parts 142 separately arranged on the driving substrate 110, wherein each of the bonding parts 142 is correspondingly disposed between the first type electrode 124 of each of the micro light-emitting devices 120 and the driving substrate 110, so that each of the micro light-emitting devices 120 is electrically connected to the scan line driving circuit 114, the data line driving circuit 116, and the control circuit 118 of the driving substrate 110 via each of the bonding parts 142.

In addition, the display apparatus 100a provided in the embodiment further includes an isolation layer 150 disposed on the driving substrate 110 and at least covering the first type electrode 124 of each of the micro light-emitting devices 120, and the common electrode 130a is located on the isolation layer 150. Particularly, the isolation layer 150 is disposed between the common electrode 130a and the driving substrate 110 and covers the bonding parts 142 as well as the epitaxial structure 122 and the first type electrode 124 of each of the micro light-emitting devices 120, so as to prevent short circuit of display apparatus 100a. In other words, the common electrode 130a provided in the embodiment does not directly contact the epitaxial structure 122 and the first type electrode 124 of each of the micro light-emitting devices 120 as well as the bonding parts 142. Herein, a material of the isolation layer 150 may be an insulation material, such as a photo-sensitive material (e.g., photoresistor), a thermally sensitive material (e.g., a polymer adhesive), silicon oxide ($SiO_x$), alumina ($Al_2O_3$), aluminum nitride (AlN), or silicon nitride ($SiN_x$), but the invention is not limited thereto. In particular, the common electrode 130a and a surface 152a of the isolation layer 150 are conformally arranged, so that the difficulty of making the common electrode 130a may be reduced.

In short, in the display apparatus 100a provided in the embodiment, the common electrode 130a is arranged in a transverse manner on the side surface S1 of the second electrode 126 of the micro light-emitting devices 120, so that the micro light-emitting devices 120 expose the upper surface S2 of the second type electrode 126 and maintains the forward light-emitting efficiency of the micro light-emitting devices 120. Moreover, the common electrode 130a made of a metallic material also has better conductivity than the conventional common electrode made of transparent metal oxides (e.g., ITO), so as to increase a transverse conductivity of the display apparatus 100a. Accordingly, the display apparatus 100a provided in the embodiment has good current transmission capability.

The reference numerals and some of the contents provided in the previous embodiment are used in the following embodiments, in which identical reference numerals indicate identical or similar components, and repeated descriptions of the same technical contents are omitted. Reference of the omitted parts can be found in the previous embodiment, and no repeated description is provided in the following embodiments.

Figure 2:
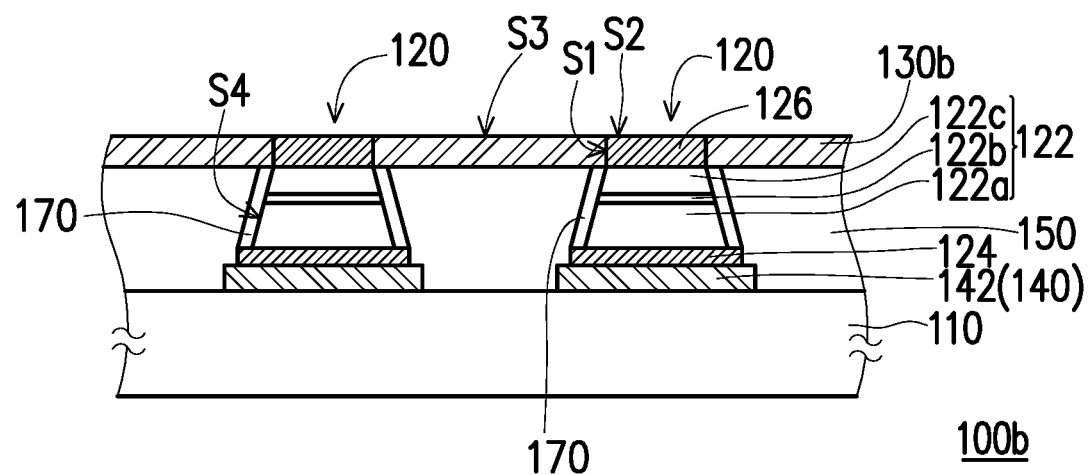
FIGS. 2 to 8 are schematic cross-sectional views of a portion of a display apparatus according to respective embodiments of the invention.

FIG. 2 is a schematic cross-sectional view of a portion of a display apparatus according to another embodiment of the invention. Referring to both FIG. 1B and FIG. 2, a display apparatus 100b provided in the embodiment is similar to the display apparatus 100a depicted in FIG. 1B, and the difference therebetween is as follows: the display apparatus 100b provided in the embodiment further includes a plurality of insulation structures 170, each of which covers the epitaxial structure 122 of a corresponding micro light-emitting device 120 and is located between the epitaxial structure 122 and the isolation layer 150. In detail, each of the insulation structures 170 is embodied as covering a surrounding surface S4 of the epitaxial structure 122 of the corresponding micro light-emitting device 120. Herein, each of the insulation structures 170 appears to have a square shape in a vertical cross-section. However, in other embodiments not shown in the drawings, the insulation structure may be arc-shaped or may have other irregular shapes; the invention is not limited thereto. As long as the insulation structure is able to cover the surrounding surface S4 of the epitaxial structure 122, so as to prevent the external water vapor or oxygen from entering the epitaxial structure 122, these embodiments are considered as falling in the scope of the invention. In particular, each of the insulation structures 170 may also cover a surrounding surface of the first type electrode 124 of the corresponding micro light-emitting device 120; the invention is not limited thereto. Herein, a top surface S3 of a common electrode 130b provided in the embodiment is aligned to the upper surface S2 of each of the second type electrodes 126. That is, the common electrode 130b extends in a substantially flat manner between each of the micro light-emitting devices 120 and has no height difference with the upper surface of each of the second type electrodes 126, so that a protective layer (not shown) may be subsequently formed on the display apparatus 100b to protect the common electrode 130b and the micro light-emitting devices 120, and thereby better yield may be achieved. However, in other embodiments not shown, the top surface of the common electrode may also have a height difference with the upper surface of each of the second type electrodes. For example, the top surface of the common electrode may be slightly lower than the upper surface of each of the second type electrodes, and the common electrode may also extend in a wave-like manner between each of the micro light-emitting devices. Herein, a material of the insulation structures 170 may be an insulation material, such as aluminum oxide, aluminum nitride, silicon oxide, or silicon nitride, but the invention is not limited thereto.

Figure 3:
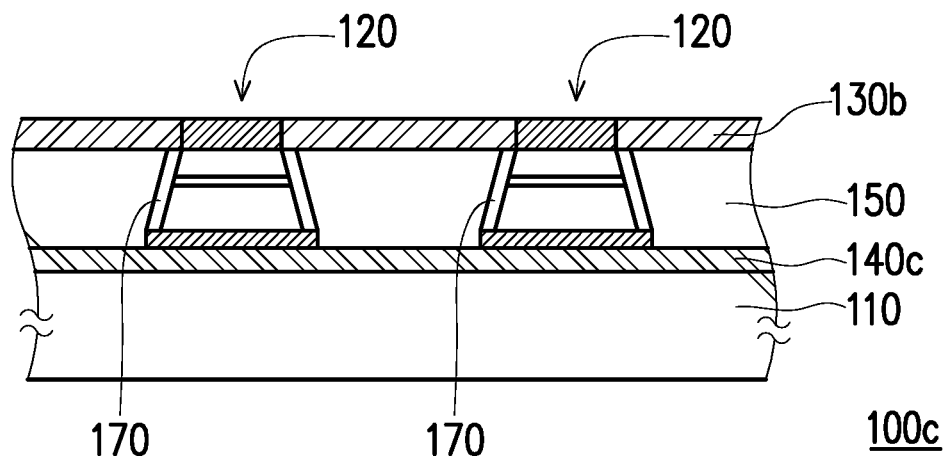

FIG. 3 is a schematic cross-sectional view of a portion of a display apparatus according to another embodiment of the invention. Referring to both FIG. 2 and FIG. 3, a display apparatus 100c provided in the embodiment is similar to the display apparatus 100b depicted in FIG. 2, and the difference therebetween is as follows: a bonding pad 140c provided in the embodiment is a successive structure and is electrically connected to the micro light-emitting devices 120 on the driving substrate 110. Herein, the bonding pad 140c is electrically connected to the first type electrode 124 of each of the micro light-emitting devices 120, which is conducive to the subsequent driving control of light emission, but the invention is not limited thereto.

Figure 4:
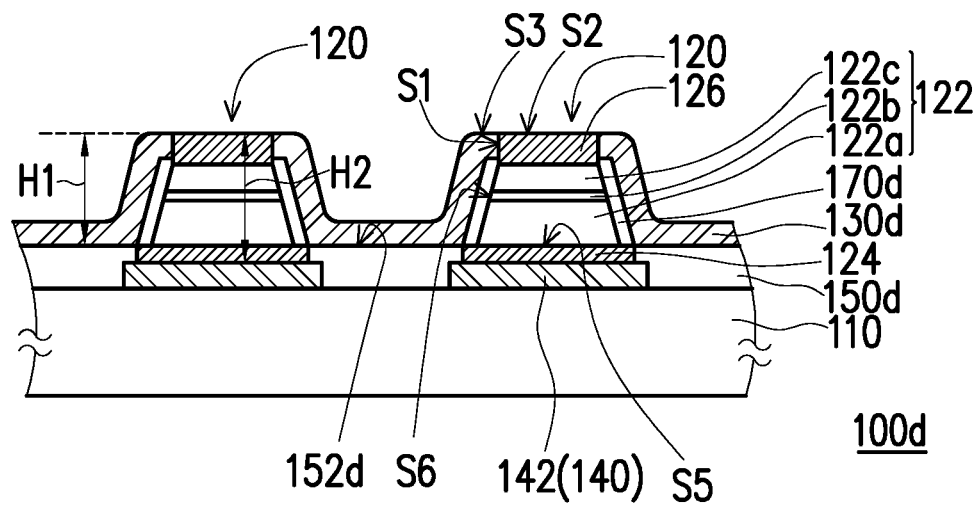

FIG. 4 is a schematic cross-sectional view of a portion of a display apparatus according to another embodiment of the invention. Referring to both FIG. 2 and FIG. 4, a display apparatus 100d provided in the embodiment is similar to the display apparatus 100b of FIG. 2, and the difference therebetween is as follows: an isolation layer 150d provided in the embodiment only covers the first type electrode 124 of each of the micro light-emitting devices 120 as well as the bonding parts 142, a common electrode 130d and the micro light-emitting devices 120 are conformally arranged, and the common electrode 130d covers a plurality of insulation structures 170d as well as the side surface S1 of the second type electrodes 126. Herein, a top surface 152d of the isolation layer 150d provided in the embodiment is aligned to an upper surface S5 of each of the first type electrodes 124, but the invention is not limited thereto. Herein, the insulation structures 170d cover the epitaxial structure 122 as well as part of the side surface S1 of each of the second type electrodes 126 and are located between the epitaxial structure 122 and the common electrode 130d. Particularly, the common electrode 130d provided in the embodiment is electrically insulated from the first type electrodes 124 and the bonding parts 142 via the isolation layer 150d, and the common electrode 130d is electrically insulated from the epitaxial structures 122 via the insulation structures 170d. In the embodiment, the insulation structures 170d not only cover the epitaxial structures 122 but also extend to part of the side surfaces S1 of the second type electrodes 126, so as to ensure that the display apparatus 100d does not encounter the current leakage issue. However, in other embodiments not shown in the drawings, the insulation structures may not cover the side surfaces of the second type electrodes, but the invention is not limited thereto. In addition, the common electrode 130d on the micro light-emitting devices 120 has a regular trapezoidal cross-section similar to a trapezoidal cross-section of the micro light-emitting devices 120, and the common electrode 130d has an inverted trapezoidal cross-section between the micro light-emitting devices 120. Preferably, the top surface S3 of the common electrode 130d has a first vertical height H1 in a vertical cross-section, each of the micro light-emitting devices 120 has a second vertical height H2 in the vertical cross-section, and a ratio of the first vertical height H1 to the second vertical height H2 is from 0.1 to 1. If the ratio is less than 0.1, the contact area of the common electrode 130d and the side surface S1 of each of the second type electrodes 126 may not be sufficient. If the ratio is greater than 1, the difficulty of making the common electrode 130d is increased. More preferably, the ratio is between 0.1 and 0.5. In particular, the common electrode 130d covers one side surface S6 of each of the light-emitting layers 122b; therefore, a side light emitted by the light-emitting layers 122b may be reflected to a forward light-emitting surface of each of the micro light-emitting devices 120, thereby increasing the forward light-emitting efficiency.

Figure 5:
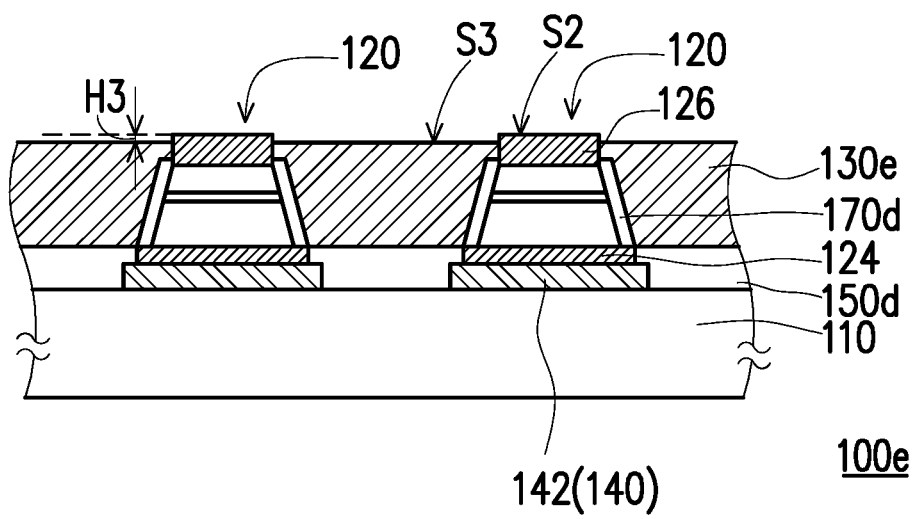

FIG. 5 is a schematic cross-sectional view of a portion of a display apparatus according to another embodiment of the invention. Referring to both FIG. 4 and FIG. 5, a display apparatus 100e provided in the embodiment is similar to the display apparatus 100d depicted in FIG. 4, and the difference therebetween is as follows: a material of a common electrode 130e provided in the embodiment may be a conductive polymer material, such as polythiophene, polypyrrole, polyaniline or polydioxythiophene:polystyrene sulfonic acid (PEDOT:PSS), and mixtures thereof, and the common electrode 130e may be formed on the driving substrate 100 by, for example, coating. For example, PEDOT:PSS is a material in a liquid state, has good electrical conductivity, has good light and thermal stability, and has high light transmittance, and therefore PEDOT:PSS is suitable as a material of the common electrode 130e. Herein, a height difference H3 is between the top surface S3 of the common electrode 130e and the upper surface S2 of each of the second type electrodes 126 in the vertical cross-section, so that the micro light-emitting devices 120 not only can emit light from the side but also can emit light in a forward direction. As shown in FIG. 5, the top surface S3 of the common electrode 130e is embodied to be slightly lower than the upper surface S2 of each of the second type electrodes 126. In the embodiment, the common electrode 130e may also extend in a substantially flat manner between each of the micro light-emitting devices 120. However, in other embodiments not shown in the drawings, the common electrode may also extend in a wave-like manner between each of the micro light-emitting devices, and the invention is not limited thereto.

Figure 6:
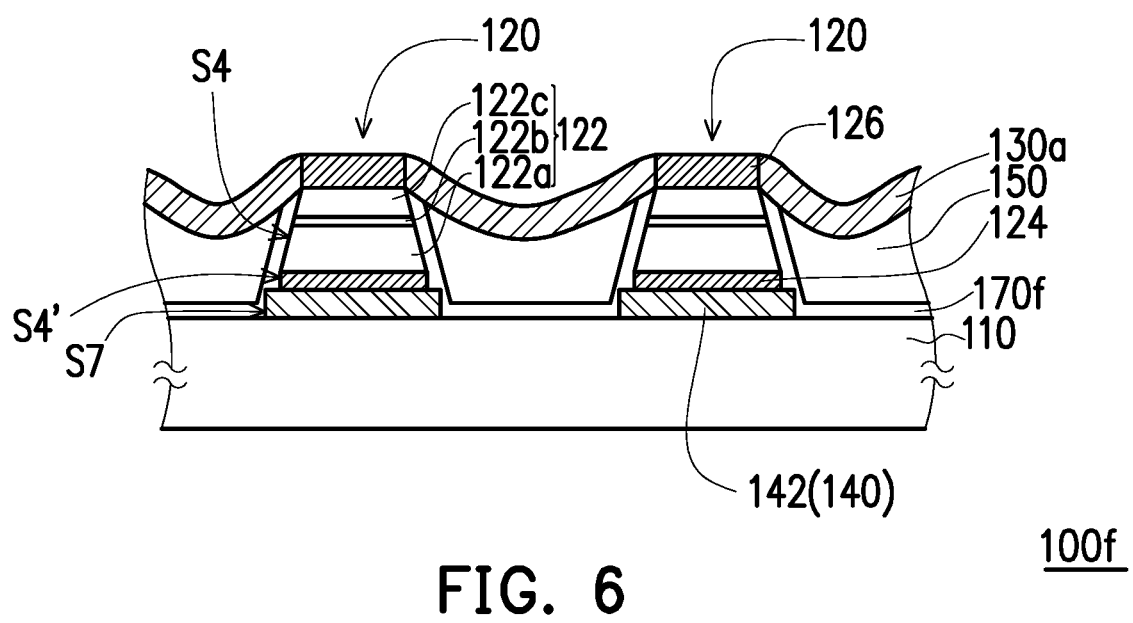

FIG. 6 is a schematic cross-sectional view of a portion of a display apparatus according to another embodiment of the invention. Referring to both FIG. 1B and FIG. 6, a display apparatus 100f provided in the embodiment is similar to the display apparatus 100a depicted in FIG. 1B, and the difference therebetween is as follows: the display apparatus 100f provided in the embodiment further includes an insulation structure 170f at least covering the epitaxial structure 122 and the first type electrode 124 of a corresponding micro light-emitting device 120. In detail, the insulation structure 170f provided in the embodiment is embodied as covering the surrounding surface S4 of the epitaxial structure 122, the surrounding surface S4' of the first type electrode 124 of the corresponding micro light-emitting device 120, and a surrounding surface S7 of the bonding parts 142, so that the common electrode 130a is electrically insulated from other conductive components to prevent the external water vapor or oxygen from entering the epitaxial structure 122, the first type electrode 124, and the bonding parts 142. Herein, the insulation structure 170f appears to have a square shape in a vertical cross-section. However, in other embodiments not shown in the drawings, the insulation structure may be arc-shaped or may have other irregular shapes, and the invention is not limited thereto. As long as the insulation structure is able to cover the surrounding surface S4 of the epitaxial structure 122, the surrounding surface S4 of the first type electrode 124, and the surrounding surface S7 of the bonding parts 142, and the common electrode 130a is electrically insulated from other conductive components, these embodiments are considered as falling in the scope of the invention.

Figure 7:
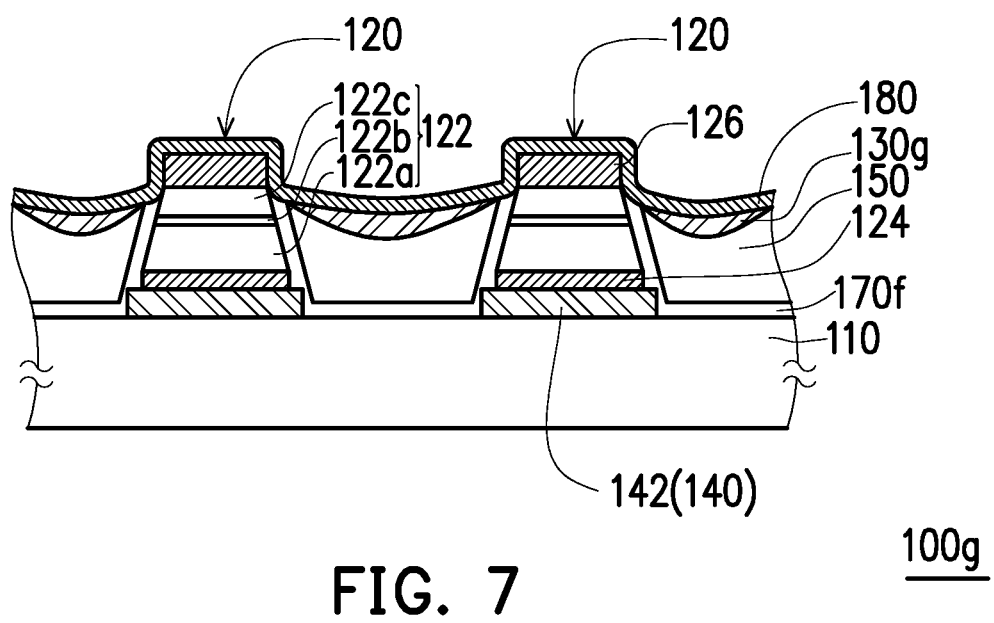

FIG. 7 is a schematic cross-sectional view of a portion of a display apparatus according to another embodiment of the invention. Referring to both FIG. 6 and FIG. 7, a display apparatus 100g provided in the embodiment is similar to the display apparatus 100f depicted in FIG. 6, and the difference therebetween is as follows: the display apparatus 100g provided in the embodiment further includes a transparent electrode 180 that is disposed on the second type electrodes 126 and a common electrode 130g, wherein the transparent electrode 180 directly contacts and is electrically connected to the second type electrodes 126 and the common electrode 130g. In detail, the common electrode 130g provided in the embodiment does not directly contact the second type electrodes 126, but the common electrode 130g is electrically connected to the second type electrodes 126 via the transparent electrode 180. Herein, a ratio of a thickness of the transparent electrode 180 to a thickness of the second type electrodes 126 is less than or equal to 0.4. More preferably, the ratio of the thickness of the transparent electrode 180 to the thickness of the second type electrodes 126 is less than or equal to 0.15, which reduces shading of the micro light-emitting devices 120. Specifically, the transparent electrode 180 is a transparent conductive film having a thickness of less than or equal to 1000 Å, such as ITO or indium zinc oxide (IZO). Since the thickness of the transparent electrode 180 is much smaller than a thickness of a known thick common electrode, the transparent electrode 180 does not hinder the micro light emitting devices 120 from emitting light. The transparent electrode 180 also assist the second type electrodes 126 in being electrically connected to the common electrode 130g, and the current transmission is made via the common electrode 130g in most cases. Thereby, better ohmic contact between the common electrode 130g and the second type semiconductor layers 122c may be achieved, and good electrical conductivity may be ensured. Herein, the transparent electrode 180 is substantially disposed on the second type electrodes 126 and the common electrode 130g. However, in other embodiments not shown in the drawings, the transparent electrode 180 may be partially disposed on the second type electrodes 126 and the common electrode 130g, so as to increase the light emission of the micro light-emitting devices 120; the invention is not limited thereto.

Figure 8:
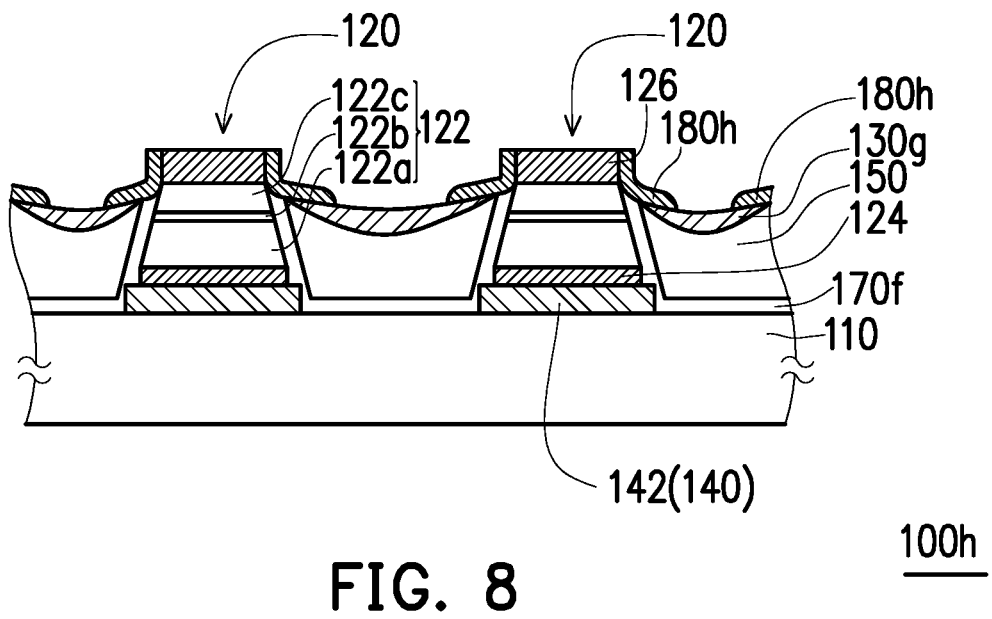

FIG. 8 is a schematic cross-sectional view of a portion of a display apparatus according to another embodiment of the invention. Referring to both FIG. 7 and FIG. 8, a display apparatus 100h provided in the embodiment is similar to the display apparatus 100g depicted in FIG. 7, and the difference therebetween is as follows: the transparent electrode 180h of the display apparatus 100h provided in the embodiment exposes the surface of the micro light-emitting devices 120, and the transparent electrode 180 is connected to a side surface of the second type electrode 126 and a portion of the common electrode 130g, so that the forward light-emitting efficiency can be increased. However, in other embodiments not shown in the drawings, the transparent electrode 180h can be partially disposed around the upper surface of the second type electrode 126, as long as the overall forward light-emitting efficiency is not affected, the transparent electrode falls within the scope of the invention.

Figure 9A:
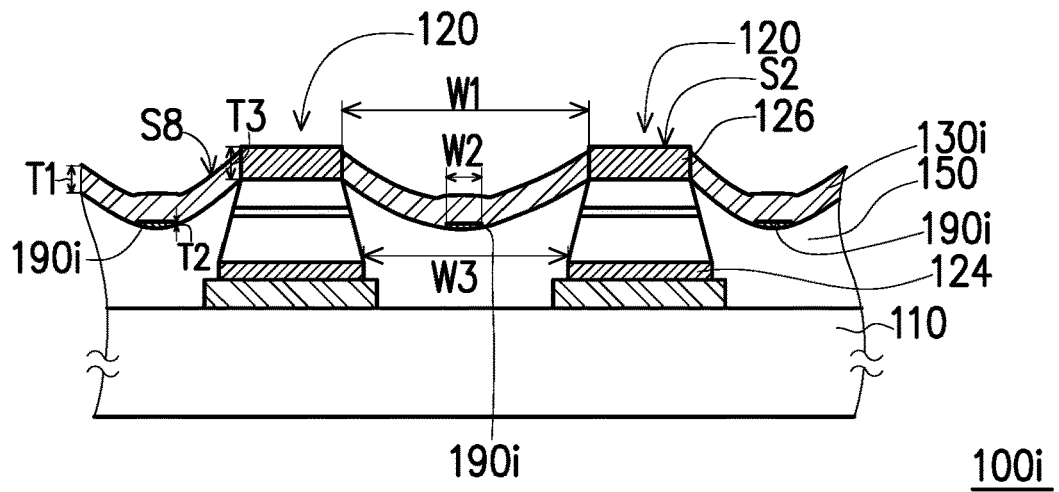
FIG. 9A is schematic cross-sectional views of a portion of a light emitting diode display according to another embodiment of the invention.
Figure 9B:
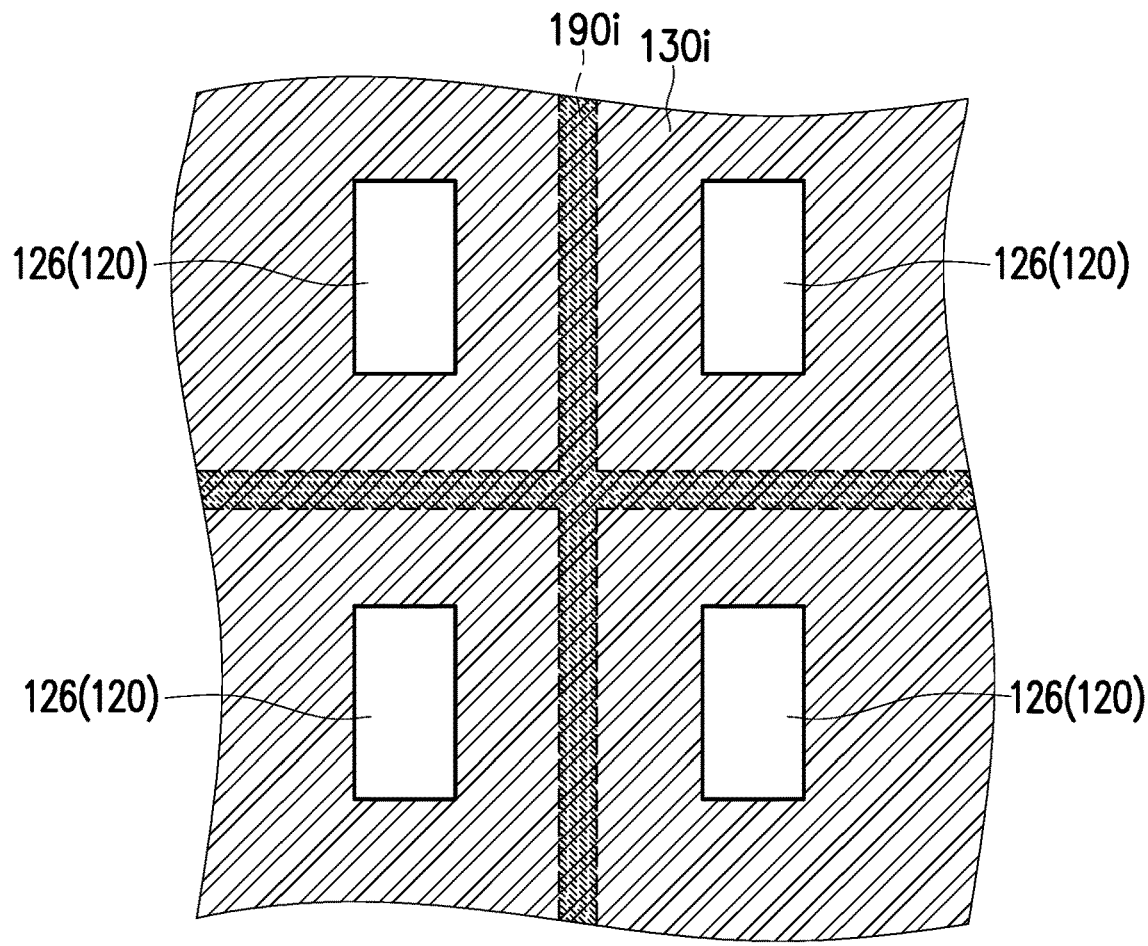
FIG. 9B is schematic top view of the light emitting diode display depicted in FIG. 9A.

FIG. 9A is schematic cross-sectional views of a portion of a light emitting diode display according to another embodiment of the invention. FIG. 9B is schematic top view of the light emitting diode display depicted in FIG. 9A. Referring to both FIG. 1B and FIG. 9A, a light emitting diode display 100i provided in the embodiment is similar to the light emitting diode display 100a depicted in FIG. 1B, and the difference therebetween is as follows: in addition to the common electrode 130i (which may be considered as the first common electrode), the light emitting diode display 100i further includes a second common electrode 190i. In detail, the first common electrode 130i is disposed on the driving substrate 110 and located between the second type electrodes 126 of the micro light-emitting devices 120, wherein the first common electrode 130i exposes at least a portion of the upper surface S2 of each of the second type electrodes 126. The second common electrode 190i is located between the second type electrodes 126 of the micro light-emitting devices 120 and electrically connected to the first common electrode 130i. Particularly, the second common electrode 190i does not directly contact the micro light-emitting devices 120. The second common electrode 190i electrically connects to the micro light-emitting devices 120 through the first common electrode 130i.

Furthermore, a transmittance of the second type electrode 126 of each of the micro light-emitting devices 120 is greater than a transmittance of the first common electrode 130i and/or the second common electrode 190i. Therefore, the light efficiency would be better to avoid be shielding. A first electrical conductivity of the first common electrode 130i and a second electrical conductivity of the second common electrode 190i are greater than a third electrical conductivity of the second type electrode 126. Herein, the second electrical conductivity of the second common electrode 190i is greater than the first electrical conductivity of the first common electrode 130i. By the differences between the electrical conductivity, the conduction efficiency is better between the second type electrode 126, the first common electrode 130i and the second common electrode 190i.

Figure 9C:
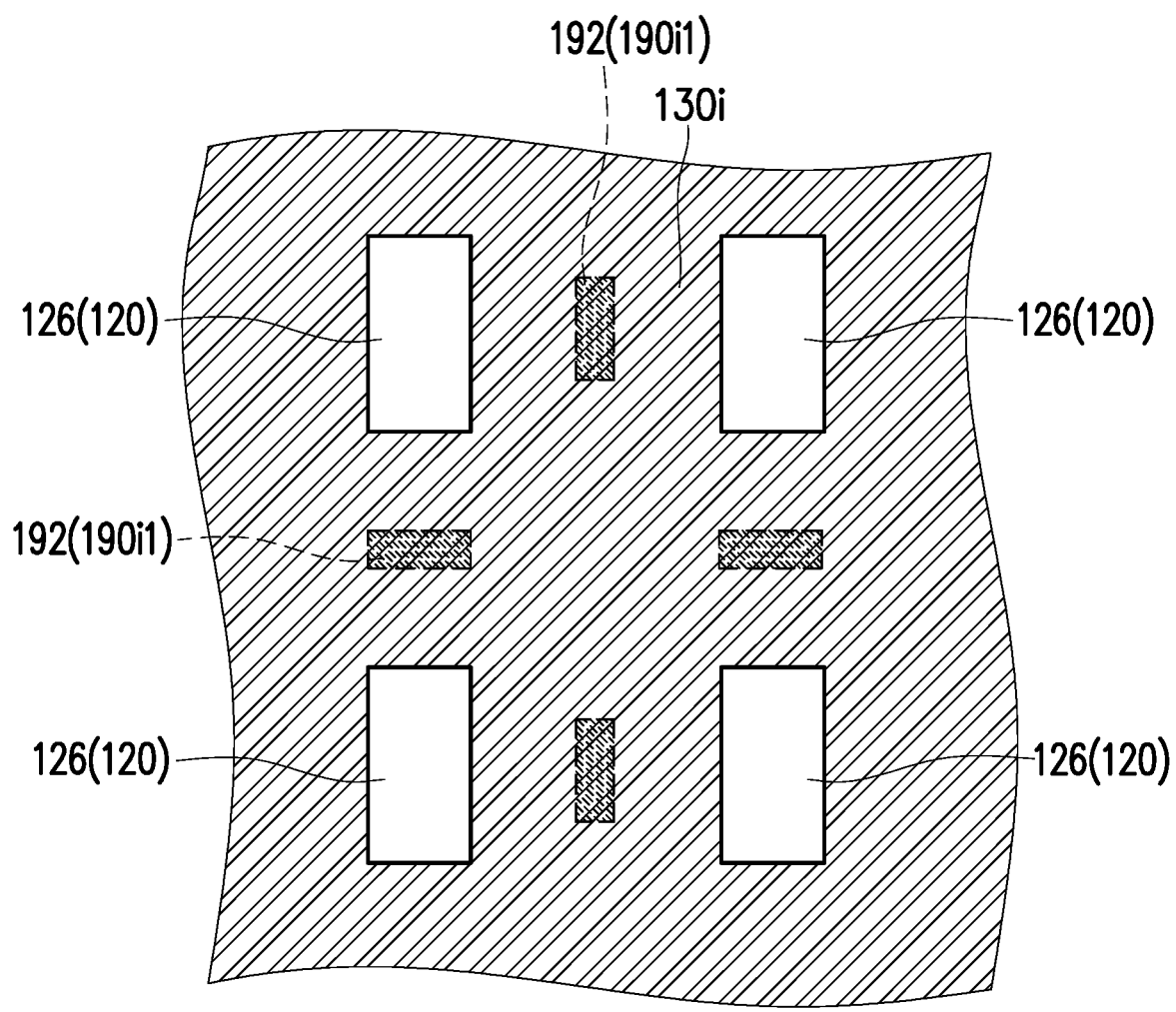
FIGS. 9C to 9D are schematic top views of a light emitting diode display according to respective embodiments of the invention.
Figure 9D:
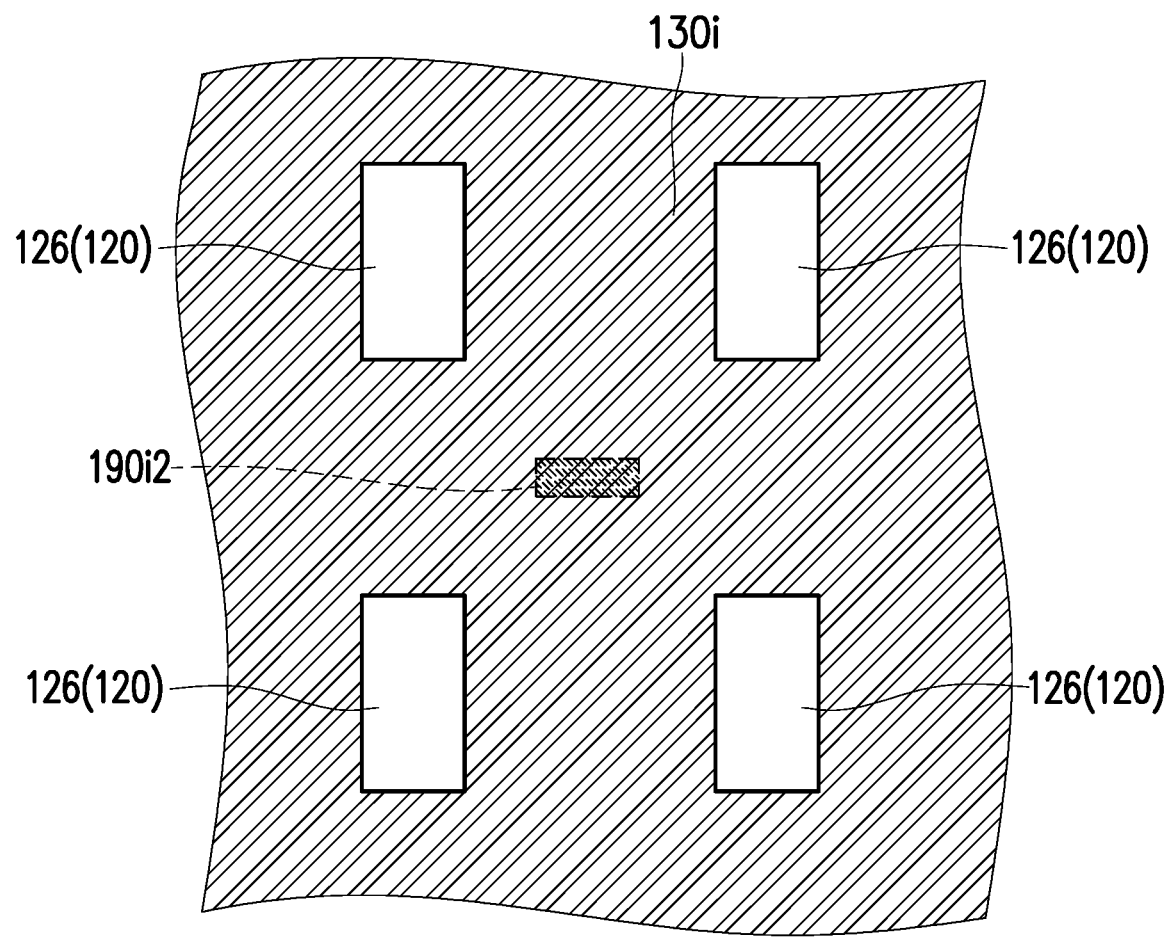

Referring to both FIG. 9A and FIG. 9B, a surface S8 of the first common electrode 130i is completely exposed, and the first common electrode 130i only on sides of the micro light-emitting devices 120. The second common electrode 190i is disposed between the driving substrate 110, the micro light-emitting devices 120 and the first common electrode 130i. Herein, the second common electrode 190i belongs to a continuous structure, but the invention is not limited thereto. Referring to FIG. 9C, in this embodiments, the second common electrode 190i1 includes a plurality of electrode portions 192 separated from each other, and each of the electrode portions 192 is located between the two micro light-emitting devices 120 to have better conductivity. Alternatively, referring to FIG. 9D, in this embodiments, the second common electrode 190i2 is located between the plurality of micro light-emitting devices 120, which can reduce the shirt issue in the process and have better conductivity.

Referring to FIG. 9A again, a ratio of a first width W1 of the first common electrode 130i to a second width W2 of the second common electrode 190i is greater than or equal to 0.3 and less than or equal to 1. Herein, the first width W1 and the second width W2 are less than 10 micrometers. If the ratio is less than 0.3, the conduction efficiency is not good. Furthermore, a ratio of the second width W2 of the second common electrode 190i to a third width W3 of two of the micro light-emitting devices 120 is greater than or equal to 0.8 and less than or equal to 1, a better process can be obtained. A first thickness T1 of the first common electrode 130i and a second thickness T2 of the second common electrode 190i are less than or equal to a third thickness T3 of the second type electrode 126, respectively. Herein, the first thickness T1 of the first common electrode 130i plus the second thickness T2 of the second common electrode 190i is less than or equal to the third thickness T3 of the second type electrode 126. A material of the first common electrode 130i and a material of the second common electrode 190i respectively include a metal, a conductively polymer material or a combination thereof. Preferably, the first common electrode 130i and the second common electrode 190i made of a metallic material also has better conductivity, so as to increase a transverse conductivity of the light emitting diode display 100i. And the second type electrode 126 is made of a metal-oxide material, for example ITO, to have a better transmittance.

Figure 10:
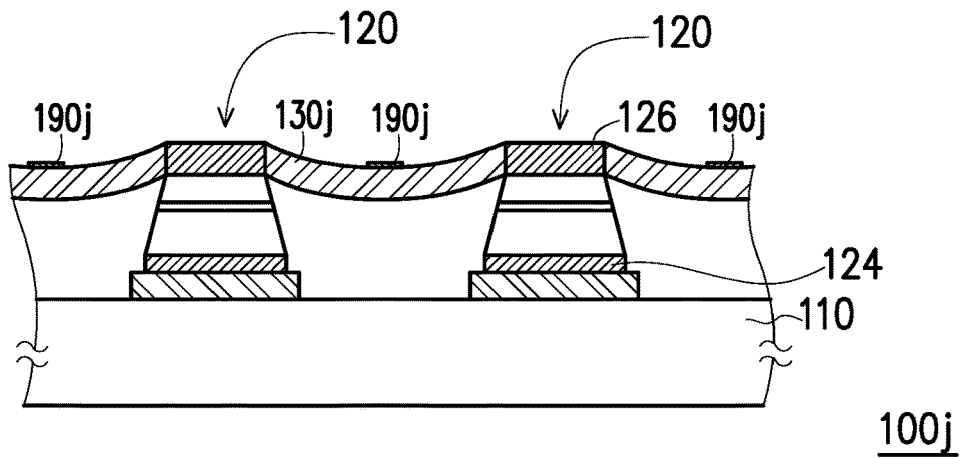
FIGS. 10 to 12 are schematic cross-sectional views of a portion of a light emitting diode display according to respective embodiments of the invention.

FIG. 10 is a schematic cross-sectional view of a portion of a light emitting diode display according to another embodiment of the invention. Referring to both FIG. 10 and FIG. 9A, a light emitting diode display 100j provided in the embodiment is similar to the light emitting diode display 100*i* depicted in FIG. 9A, and the difference therebetween is as follows: the first common electrode 130*j* is disposed between the driving substrate 110, the micro light-emitting devices 120 and the second common electrode 190*j*. Herein, second common electrode 190*j* is located on the first common electrode 130*j* and exposed to the outside.

Figure 11:
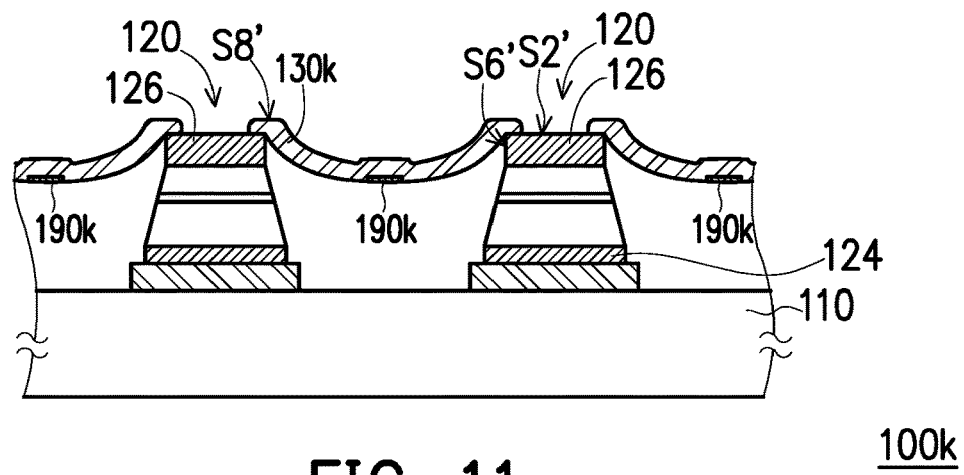

FIG. 11 is a schematic cross-sectional view of a portion of a light emitting diode display according to another embodiment of the invention. Referring to both FIG. 11 and FIG. 9A, a light emitting diode display 100*k* provided in the embodiment is similar to the light emitting diode display 100*i* depicted in FIG. 9A, and the difference therebetween is as follows: a portion of a surface S8' of the first common electrode 130*k* is exposed, and the first common electrode 130*k* is disposed on a portion of upper surfaces S2' and sides S6' of the micro light-emitting devices 120. An area ratio of an area of the first common electrode 130*k* disposed on the upper surfaces S2' to an area of the first common electrode 130*k* is less than or equal to 0.2. If the ratio is greater than 0.2, the light will be shield.

Figure 12:
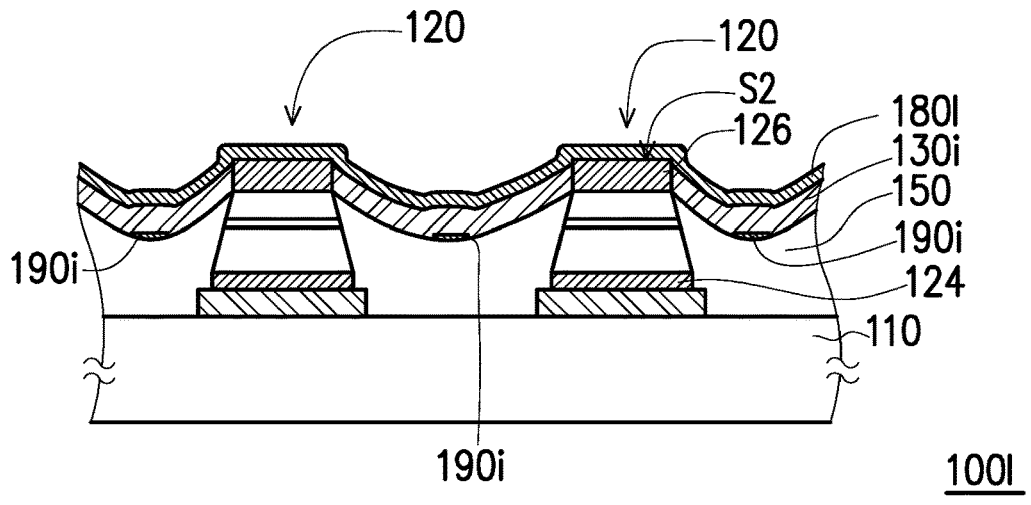

FIG. 12 is a schematic cross-sectional view of a portion of a light emitting diode display according to another embodiment of the invention. Referring to both FIG. 12 and FIG. 9A, a light emitting diode display 100*l* provided in the embodiment is similar to the light emitting diode display 100*i* depicted in FIG. 9A, and the difference therebetween is as follows: the light emitting diode display 100*l* further includes a transparent electrode 180*l*, disposed on each of the micro light-emitting devices 120, the first common electrode 130*i* and the second common electrode 190*i*. The transparent electrode 180 at least directly contacts the second type electrode 126 of each of the micro light-emitting devices 120 and the first common electrode 130*i*. However, in other embodiments not shown in the drawings, the transparent electrode can be at least directly contact the second type electrode of each of the micro light-emitting devices, the first common electrode and the second common electrode, and the invention is not limited thereto.

It should be noted that the common electrode (including the first common electrode and the second common electrode) is not necessarily the common electrode of all of the micro light-emitting devices, but may be the common electrode of the partial micro light-emitting devices. That is, the micro light-emitting devices can be controlled in a partition region manner.

To sum up, the light emitting diode display provided in an embodiment of the invention includes the first common electrode exposing at least a portion of an upper surface of the second type electrode, and the second common electrode located between the second type electrodes of the micro light-emitting devices and electrically connected to the first common electrode, wherein the second common electrode does not directly contact the plurality of micro light-emitting devices. Therefore, the micro light-emitting devices can have the favorable forward light-emitting efficiency and good electrical conductivity.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A light emitting diode display, comprising:
   a driving substrate;
   a plurality of micro light-emitting devices, arranged on the driving substrate, each of the plurality of micro light-emitting devices comprising an epitaxial structure, a first type electrode, and a second type electrode, the first type electrode and the second type electrode being disposed on the opposite sides of the epitaxial structure;
   a first common electrode, disposed on the driving substrate and located between the second type electrodes of the plurality of micro light-emitting devices, wherein the first common electrode exposes at least a portion of an upper surface of each of the second type electrodes, and
   a second common electrode, located between the second type electrodes of the plurality of micro light-emitting devices and electrically connected to the first common electrode, wherein the second common electrode does not directly contact the plurality of micro light-emitting devices.

2. The light emitting diode display as recited in claim 1, wherein a transmittance of the second type electrode of each of the plurality of micro light-emitting devices is greater than a transmittance of the first common electrode and/or the second common electrode.

3. The light emitting diode display as recited in claim 1, wherein a first electrical conductivity of the first common electrode and a second electrical conductivity of the second common electrode are greater than a third electrical conductivity of the second type electrode.

4. The light emitting diode display as recited in claim 3, wherein the second electrical conductivity of the second common electrode is greater than the first electrical conductivity of the first common electrode.

5. The light emitting diode display as recited in claim 1, wherein the second common electrode is disposed between the driving substrate, the plurality of micro light-emitting devices and the first common electrode.

6. The light emitting diode display as recited in claim 1, wherein the first common electrode is disposed between the driving substrate, the plurality of micro light-emitting devices and the second common electrode.

7. The light emitting diode display as recited in claim 1, wherein a ratio of a first width of the first common electrode to a second width of the second common electrode is greater than or equal to 0.3 and less than or equal to 1.

8. The light emitting diode display as recited in claim 7, wherein the first width and the second width are less than 10 micrometers.

9. The light emitting diode display as recited in claim 1, wherein a ratio of a width of the second common electrode to a width of two of the plurality of micro light-emitting devices is greater than or equal to 0.8 and less than or equal to 1.

10. The light emitting diode display as recited in claim 1, wherein a surface of the first common electrode is completely exposed, and the first common electrode only on sides of the plurality of micro light-emitting devices.

11. The light emitting diode display as recited in claim 1, wherein a portion of a surface of the first common electrode is exposed, and the first common electrode is disposed on a portion of upper surfaces and sides of the plurality of micro light-emitting devices.

12. The light emitting diode display as recited in claim 11, wherein an area ratio of an area of the first common electrode disposed on the upper surfaces to an area of the first common electrode is less than or equal to 0.2.

13. The light emitting diode display as recited in claim 1, wherein a material of the first common electrode and a material of the second common electrode respectively comprise a metal, a conductively polymer material or a combination thereof.

14. The light emitting diode display as recited in claim 1, wherein a first thickness of the first common electrode and a second thickness of the second common electrode are less than or equal to a third thickness of the second type electrode, respectively.

15. The light emitting diode display as recited in claim 14, wherein the first thickness of the first common electrode plus the second thickness of the second common electrode is less than or equal to the third thickness of the second type electrode.

16. The light emitting diode display as recited in claim 1, further comprising:
 a transparent electrode, disposed on each of the plurality of micro light-emitting devices, the first common electrode and the second common electrode, wherein the transparent electrode at least directly contacts the second type electrode of each of the plurality of micro light-emitting devices and the first common electrode or the second type electrode of each of the plurality of micro light-emitting devices, the first common electrode and the second common electrode.

\* \* \* \* \*